United States Patent [19]

Anlauf

[11] 4,344,032
[45] Aug. 10, 1982

[54] METHOD AND ARRANGEMENT FOR TESTING THE CHARACTERISTICS OF INDUCTIVE PULSE GENERATORS

[75] Inventor: Jürgen Anlauf, Goppingen, Fed. Rep. of Germany

[73] Assignee: Robert Bosch GmbH, Stuttgart, Fed. Rep. of Germany

[21] Appl. No.: 62,901

[22] Filed: Aug. 1, 1979

[30] Foreign Application Priority Data

Sep. 22, 1978 [DE] Fed. Rep. of Germany ....... 2841289

[51] Int. Cl.³ ........................ G01R 31/00; G01R 1/38
[52] U.S. Cl. ............................ 324/158 MG; 324/128; 324/158 R
[58] Field of Search ........... 324/158 R, 158 MG, 132, 324/128, 140 D; 322/99

[56] References Cited

U.S. PATENT DOCUMENTS 3,449,672 6/1969 Thomas .............................. 324/132

Primary Examiner—Ernest F. Karlsen
Attorney, Agent, or Firm—Michael J. Striker

[57] ABSTRACT

A method and device for testing inductive pulse generators of the type used as wheel-rpm feedback transducers in anti-wheel-lock action in automotive braking systems. Within a portion of the range of frequencies at which such inductive pulse generator produces output voltage pulses, the amplitude and frequency of such pulses vary approximately in proportion to each other. In accordance with the present invention, a quality characterization signal is derived which varies similarly to the ratio of pulse amplitude and pulse frequency. Thus, within such frequency range, or equivalently within the corresponding range of wheel rotation speed in the context specified above, the value of the quality characterization signal will be independent of the frequency or wheel rpm at which the test happens to be performed.

12 Claims, 5 Drawing Figures

METHOD AND ARRANGEMENT FOR TESTING THE CHARACTERISTICS OF INDUCTIVE PULSE GENERATORS

BACKGROUND OF THE INVENTION

The present invention concerns methods and equipment for testing the characteristics of inductive pulse generators, especially those used to generate a wheel rpm feedback signal in the context of an anti-wheel-lock action in a vehicle's brake system. In an anti-wheel-lock context, such an inductive pulse generator is provided for each braked wheel of the vehicle and furnishes a signal proportional to wheel rpm. When such anti-wheel-lock systems are tested for operativeness and proper functioning, it is also necessary to test their inductive pulse generators. A characteristic property of such inductive pulse generators is that in a lower region of the rpm range in which they are employed the amplitude of the voltage pulses induced in them are approximately proportional to wheel rpm and accordingly to frequency. It is known to test the inductive pulse generator by rotating the vehicle wheel provided with it at approximately the lower limit of the rpm range within which the pulses produced by the pulse generator are actually employed in use. At this rpm, the frequency of the signal produced by the pulse generator is compared to a predetermined limit frequency, and the pulse generator is then considered good if the amplitude of the pulses generated at a still lower frequency reach or exceed a predetermined threshold level. A disadvantage of such a testing technique is that the measurement is not conveniently performed more than once in quick succession, namely when the predetermined rpm limit has been approximately reached, e.g., by shutting off the engine and letting the vehicle wheel coast to a stop. Additionally, such set-ups are arranged to provide a good-bad indication which presupposes known dimensioning of the inductive pulse generator, so that the equipment employed must in general be readjusted each time an inductive pulse generator of different dimensions, or even an inductive pulse generator of the same dimensions but in a different anti-wheel-lock system, is involved.

SUMMARY OF THE INVENTION

It is a general object of the invention to provide a testing method and arrangement for such inductive pulse generators not requiring the establishment of a particular frequency, which in a wheel-rpm context would require the establishment of a particular wheel-rpm value.

In accordance with the present invention, a first signal is generated having a value proportional to the amplitude of the pulses produced by the inductive pulse generator at whatever frequency (rpm, in a vehicle-wheel context) is involved. A second signal is generated having a value proportional to the frequency of the pulses produced by the inductive pulse generator. A third signal is derived in dependence upon the relative values of the first and second signals, and the value of the third signal is compared against a predetermined value typical for inductive pulse generators of the particular design involved in a given instance, the discrepancy between such predetermined value and the value of the third signal constituting a measure of the quality of the inductive pulse generator.

One advantage of the invention is that the quality of the inductive pulse generator can be ascertained anywhere within a very considerable range of frequency, or range of rpm when the pulse generator is used for rpm transducer purposes. The inductive pulse generator can be conveniently tested anywhere within at least that frequency range within which the amplitudes and frequencies of the pulses it produces vary in approximate proportion to each other. Accordingly, it becomes possible to test the inductive pulse generator, if used on a vehicle wheel, with the wheel spinning at constant speed or at varying speed. The vehicle wheel can be spun on a wheel-spinning stand at differing speeds, or can be spun by hand in the case of a merely jacked-up vehicle.

Advantageously, it is possible to perform the quality measurement upon the inductive pulse generator several times in succession, for example, as a spinning wheel is coasting to a stop. This greatly reduces the probability of a false measurement such as can arise when the quality measurement is as in prior art performed a single time and perhaps inaccurately.

If the value of the third signal is equal to the quotient of the values of the first and second signal, and if the vehicle rpm is within the range within which the pulse amplitude and pulse frequency vary approximately in proportion to each other, then the value of the third signal can be used rather directly as a characterization of the quality of the inductive pulse generator, e.g., by mere application to a comparator or to a subtractor. Alternatively, however, the characteristic value (value of the aforementioned third signal) for the inductive pulse generator can be displayed directly (e.g., without first forming the difference between it and a reference or standard value) or can be registered directly for later evaluation, so that the testing equipment employed need not be adjusted in any respect whatsoever when testing inductive pulse generators of differing sensitivities. A variety of means can be employed for generating the aforementioned third signal, involving the use of low-pass filters, frequency-controlled capacitor-charging or -discharging techniques, digital calculation performed by computer, and so forth. Use can, for example, be made of any devices or circuits capable of forming an appropriate difference, ratio, quotient or differential quotient.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
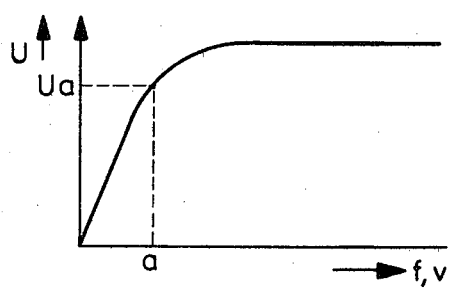
FIG. 1 is a voltage amplitude versus frequency diagram referred to in elucidating concepts of the invention.

FIG. 1 depicts the amplitude of the output voltage U of an inductive pulse generator 1 (see FIG. 2) comprised of a magnetized or magnetizable core 2 (see FIG. 2) and a surrounding coil 3, plotted as a function of frequency. If the inductive pulse generator 1 is used as the rpm feedback transducer for a vehicle wheel, then the frequency of the output voltage U produced by the pulse generator is in turn proportional to the rotary speed of such wheel and likewise proportional to the velocity of whatever magnetic-flux-altering structure is provided on such vehicle wheel for movement past inductive pulse generator 1 as such wheel rotates. Up to a frequency a, the output voltage amplitude increases almost proportionally with frequency up to a value Ua, after which point further increase of frequency does not continue to result in a proportional increase of output voltage amplitude. Frequency a may correspond to a vehicle speed of 10 to 20 km/h, depending upon what criterion for linearity one employs in defining the value of frequency a. Within the frequency range from $f=0$ to $f=a$, the techniques of the present invention can be freely practiced using the inventive apparatus described below, and be practiced without particular attention paid to changes of rotary speed or output signal frequency inasmuch as such changes do not substantially affect the quality characterization signal obtained using the present invention.

Figure 2:
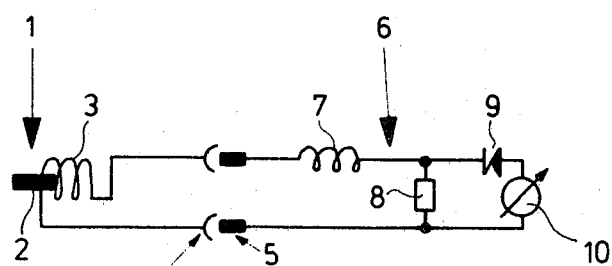
FIG. 2 depicts an exemplary embodiment of the invention making use of a low-pass filter to obtain the quality characterization signal for an inductive pulse generator.

FIG. 2 depicts a first embodiment of an apparatus for developing the desired quality characterization signal for the inductive pulse generator 1. This embodiment makes use of the fact that the impedance presented by an inductance is proportional to frequency. The terminals of coil 3 of inductive pulse generator 1 are connected to female elements of a socket connector 4, which is typically located accessibly when such pulse generators are provided on a vehicle for wheel-rpm feedback transducer use. Socket connector 4 removably receives male connecting elements 5 of an insertable plug connected across the input of a testing device 6. Testing device 6 comprises a voltage divider connected across its input terminals, the voltage divider being comprised of an inductance 7 and a resistor 8. The voltage across resistor R is of course equal to its resistance divided by the sum of its resistance and the impedance of inductance 7. Accordingly, the fraction of voltage developed across the coil 3 of pulse generator 1 actually received across the terminals of resistor R varies approximately in inverse proportion to frequency, whereas the amplitude of the voltage applied across voltage divider 7, 8 varies approximately in direct proportion to frequency. Thus, the voltage across voltage-divider resistor 8 will be to a very substantial degree independent of frequency and constant with varying frequency, so long as the frequency is between $f=0$ and $f=a$. Accordingly, within a corresponding rotary speed range, a vehicle wheel associated with such a pulse generator can be freely permitted to vary in speed. Connected in parallel with resistor 8 is the series connection of a zener diode 9 and a display 10, e.g., a voltmeter. The zener diode is provided to suppress low amplitude values, associated with low frequencies or wheel speeds near zero, in which the amplitude versus frequency characteristic of the pulse generator is quite non-linear. Use could also be made of an amplitude discriminator. Alternatively, such zener diode or amplitude discriminator could be used to cause meter 10 to give no reading except when the signal developed across resistor 8 has a value at least equal to a minimum acceptable quality value, for example with the scale on meter 10 calibrated at zero for the lowest reading meter 10 can produce, i.e., so that meter 10 directly indicate the amount of the difference relative to the minimum acceptable quality value.

Figure 3:
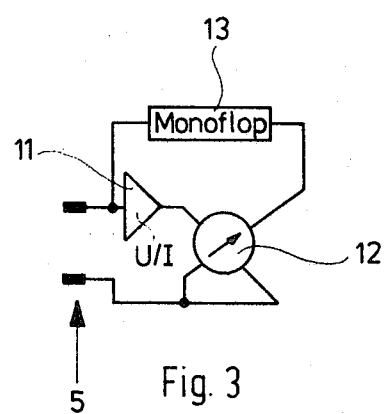
FIG. 3 depicts an embodiment in which the quality characterization signal is obtained using a cross-coil or T-coil metering mechanism.

FIG. 3 depicts an embodiment, in which the plug connector of the testing instrument is again denoted by numeral 5. One terminal of the plug connector is connected to the input of an amplifier 11 which produces at its output a current proportional to the voltage applied to its input. The output of amplifier 11 furnishes current to one winding of a cross-coil or T-coil instrument 12. The other winding of cross-coil instrument 12 receives a current whose amplitude is proportional to frequency. In particular, a monostable multivibrator 13 is connected between the input of amplifier 11 and one terminal of the second coil of instrument 12. Monostable multivibrator 13 furnishes at its output a pulse train whose constituent pulses are each triggered by an input pulse and all of equal duration, so that the average value of the resultant current established in the second coil of instrument 12 is proportional to the frequency of pulses applied to the input of monostable multivibrator 13. The cross-coil or T-coil instrument 12 forms the quotient of the two currents and accordingly the ratio U/f.

Figure 4:
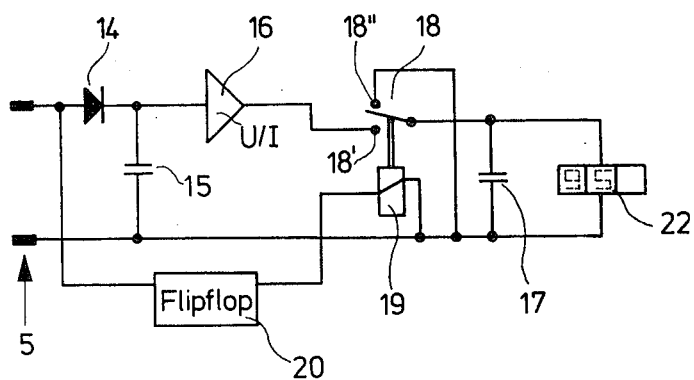
FIG. 4 depicts an embodiment in which the quality characterization signal is obtained by charging a capacitor at a rate proportional to the pulse generator signal amplitude for durations dependent upon the time spacing between successive pulses of the pulse generator signal.

FIG. 4 depicts an embodiment in which the plug connector for the testing instrument is again denoted by numeral 5. Connected across the input of the instrument is a first capacitor 15, provided with a charging diode 14. The voltage which develops across capacitor 15 is proportional to the peak value of the pulses produced in the coil 3 of inductive pulse generator 1. The voltage across capacitor 15 is applied through the intermediary of an operational amplifier 16 to a second capacitor 17. Operational amplifier 16 furnishes a constant output current whose magnitude is proportional to the voltage across first capacitor 15. This current charges second capacitor 17 when a relay contact 18' connected between operational amplifier 16 and second capacitor 17 is closed. The voltage across second capacitor 17 increases in proportion to elapsed time when contact 18' is closed. In this circuit the time interval during which relay contact 18' is closed is made proportional to the time interval between successive pulses produced by the inductive pulse generator 1 to be examined. To implement this, a relay winding 19 which controls a relay contact 18 is controlled by a flip-flop 20, which in turn is triggered by the pulses produced by the inductive pulse generator being tested. One pulse produced by the pulse generator sets flip-flop 20; the next pulse from the pulse generator resets flip-flop 20; and so forth. Relay contact 18' closes each time flip-flop 20 is set. Each time flip-flop 20 is reset a relay contact 18" closes, connecting together both terminals of second capacitor 17 and thereby discharging it. Accordingly, the duration of the charging interval for the repeatedly discharged second capacitor 17 varies in inverse proportion to the frequency of the pulses produced by the inductive pulse generator 1. Thus, the peak value of the voltage repeatedly built up across capacitor 17 is proportional to the quotient of the amplitude and the frequency of the pulses produced by inductive pulse generator 1. This peak voltage can be metered using a peak-voltage meter, here shown as a digital voltmeter 22.

Figure 5:
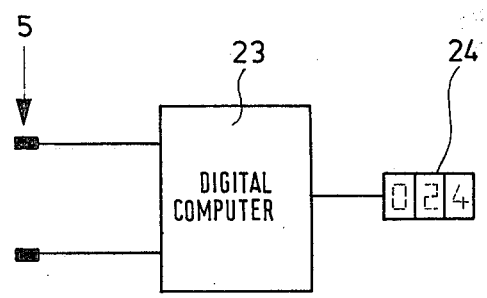
FIG. 5 schematically represents the use of a computer in developing such a quality characterization.

In the embodiment depicted in FIG. 5, the plug connector 5 supplies the pulse-generator voltage to the input of a small, special-purpose computer 23 operative for ascertaining by digital computation the quotient of voltage and frequency. The computer 23 could be provided with a printer for printing out the computed quotient value, although here the computer 23 is shown merely provided with a digital-display read-out 24. The various interfacing and peripheral stages with which such digital computer 23 would of course be provided, are not depicted in FIG. 5 because they will be evident, e.g., an analog-to-digital converter for generation of digital signals whose values represent the amplitude of the voltage produced by the inductive pulse generator, a frequency-to-digital converter for generation of digital signals whose values represent the frequency of the voltage produced by the inductive pulse generator, and so forth. The frequency-to-digital converter could, for example, be a simple frequency counter. Instead of having a simple divide one input quantity by the other program, computer 23 could be provided with a more complex program, for example in which a tabulation of corrective division factors are stored for different frequency values in the case of tests performed on a series of inductive pulse generators all of the same design, the corrective factors being such as to take into account the non-linearity of the inductive pulse generator's frequency-versus-amplitude curve, so that the quality characterization signal sought can be generated accurately even if the frequency or wheel speed involved is in excess of f=a.

It will be understood that the circuit configurations depicted in FIGS. 2-5 are merely schematic. For example, in the case of the inductance 7 of FIG. 2, use might not be made of a simple inductor but instead, to minimize the loading of the pulse generator 1, use could be made of an active low-pass filter comprised of a correspondingly configured operational-amplifier circuit.

It will be understood that each of the elements described above, or two or more together, may also find a useful application in other types of circuits and constructions differing from the types described above.

While the invention has been illustrated and described as embodied in connection with the testing of inductive pulse generators such as used to generate wheel-rpm feedback signals in automotive control systems, it is not intented to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A device for testing the sensitivity of inductive pulse generators relative to a reference value within a low frequency range such as used to generate rpm feedback signals and the like, the device comprising inductive impedance connectable to such an inductive pulse generator and operative for deriving from the output voltage pulses produced by the inductive pulse generator an auxiliary signal whose value is proportional to the ratio of the amplitude and the frequency of the output voltage pulses produced by the inductive pulse generator; and indicator means connected to receive the auxiliary signal and operative in dependence upon the reference value for generating a quality characterization signal which is indicative of the sensitivity of the pulse generator.

2. The testing device defined in claim 1, the indicator means comprising means for displaying the numerical value of the quality characterization signal.

3. The testing device defined in claim 1, the means deriving the auxiliary signal including a non-linear inductive impedance circuit having an input connected to receive the output voltage pulses from the inductive pulse generator and having an output across which the auxiliary signal develops.

4. The testing device defined in claim 3, the non-linear impedance circuit comprising a voltage divider comprised of an inductance and a resistance, the auxiliary signal developing across the resistance.

5. The testing device defined in claim 1, the indicator means including means for comparing the value of the auxiliary signal against a predetermined reference value and indicating the result of that comparison as a quality characterization signal.

6. The testing device defined in claim 5, the comparing means comprising means for ascertaining whether the value of the auxiliary signal is greater than or less than the predetermined reference value.

7. The testing device defined in claim 5, the indicator means comprising a voltage or current meter and means for applying to the meter a signal dependent upon the difference between the value of the auxiliary signal and the predetermined reference value.

8. The testing device defined in claim 6, the indicator means including means for suppressing the effect of low frequencies at which the amplitude and frequency of the inductive pulse generator do not vary in proportion to each other.

9. The testing device defined in claim 7, the indicator means including means for applying a signal to the meter only when the auxiliary signal exceeds a predetermined value.

10. A method of testing the sensitivity of inductive pulse generators such as used to generate rpm feedback signals and the like, the method comprising the steps of: generating a reference signal corresponding in amplitude to output pulses of a standard inductive pulse generator; deriving from the output pulses produced by an inductive pulse generator under test an auxiliary signal whose amplitude is proportional to the ratio of the amplitude and frequency of the output pulses produced by the generator under test within a low frequency range; and comparing the amplitudes of the reference signal and of the auxiliary signal to derive a quality characterization signal which is indicative of the sensitivity of the pulse generator under test.

11. The method defined in claim 10, the deriving of the quality characterization signal comprising deriving from the output voltage pulses produced by the inductive pulse generator under test a first signal whose value varies substantially in proportion to the amplitude of the output pulses and a second signal whose value varies substantially in proportion to the frequency of the output pulses and deriving the auxiliary signal from the first and second signals in combination.

12. The method defined in claim 11, the first and second signals being derived by applying the output voltage pulses produced by the inductive pulse generator under test across a non-linear impedance circuit.

* * * * *